(12) United States Patent
Subramanian et al.

(10) Patent No.: US 6,972,201 B1
(45) Date of Patent: Dec. 6, 2005

(54) USING SCATTEROMETRY TO DETECT AND CONTROL UNDERCUT FOR ARC WITH DEVELOPABLE BARCS

(75) Inventors: Ramkumar Subramanian, Sunnyvale, CA (US); Bhanwar Singh, Morgan Hill, CA (US); Khoi A. Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/755,794

(22) Filed: Jan. 12, 2004

(51) Int. Cl.$^7$ .............................................. H01L 21/00
(52) U.S. Cl. ........................................................ 438/14
(58) Field of Search ........................... 438/14, 694, 697

(56) References Cited

U.S. PATENT DOCUMENTS

| | | | |
|---|---|---|---|
| 5,739,909 A * | 4/1998 | Blayo et al. ................. 356/369 |
| 6,433,878 B1 * | 8/2002 | Niu et al. .................... 356/603 |
| 6,558,965 B1 | 5/2003 | Singh et al. | |
| 6,762,133 B1 * | 7/2004 | Rangarajan et al. ......... 438/745 |
| 2003/0000922 A1 * | 1/2003 | Subramanian et al. ......... 216/60 |
| 2005/0022932 A1 * | 2/2005 | Kagoshima et al. ... 156/345.24 |

* cited by examiner

*Primary Examiner*—W. David Coleman
(74) *Attorney, Agent, or Firm*—Amin & Turocy, LLP

(57) ABSTRACT

Architecture for monitoring a bottom anti-reflective coating (BARC) undercut and residual portions thereof during a development stage using scatterometry. The scatterometry system monitors for BARC undercut and residual BARC material, and if detected, controls the process to minimize such effects in subsequent wafers. If one or more of such effects has exceeded a predetermined limit, the wafer is rerouted for further processing, which can include rework, etch back of the affected layer, or rejection of the wafer, for example.

23 Claims, 6 Drawing Sheets

USING SCATTEROMETRY TO DETECT AND CONTROL UNDERCUT FOR ARC WITH DEVELOPABLE BARCS

TECHNICAL FIELD

This invention is related to semiconductor processing, and more specifically, to using scatterometry to monitor and control the effects of BARC processing.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires a high-resolution photo imaging process, conventionally known as photolithography. However, reflection of light from substrate/resist interfaces produce variations in light intensity and scattering of light in the resist during exposure, resulting in non-uniform photoresist line width upon development. In the case of highly reflective substrate regions, the problem is exacerbated, since large amplitude standing waves can create thin layers of underexposed resist at the wave minima. The underexposed layers can prevent complete resist development causing edge acuity problems in the resist profile.

Anti-reflective coatings (ARCs) are known and used to mitigate the aforementioned problems by attenuating or absorbing the light waves reflected from the substrate surface during photo exposure operations to improve image contrast. An ARC is typically interposed between the substrate surface and the photoresist so as to serve as a barrier that inhibits the reflected waves from traversing back through the photoresist and adversely affecting the imaging process, which helps in defining images. Dielectric anti-reflective coating (DARC) and bottom anti-reflective coating (BARC) are examples of anti-reflective materials that are commonly used to absorb radiation reflected from the substrate surface during the photo imaging operations of integrated circuit processing. The BARC cuts down on light scattering into the resist, and is generally available as a low-viscosity liquid, such as inorganic $SiN_x$, that can be applied onto the substrate surface using a well-known spin coating process.

However, the use thereof presents additional problems, for example, introduction of particulate contamination, requirement of tight temperature tolerances during production, etc. Moreover, developable BARCs have a tendency to result in undercut during the development process.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention disclosed and claimed herein, in one aspect thereof, comprises architecture that monitors and controls by way of scatterometry the amount of deviation of undercut BARC material from a sidewall profile that is developed away at the edges and/or sidewalls of a structure, e.g., a hole or resist line, resulting in undercut of the overlying material. If undercut reaches a deviation threshold, alternative measures must be taken, e.g., etch to remove the BARC or rework the piece. If the amount of deviation of BARC undercut from the sidewall profile is still within permissible parameters, the control system can make a determination based upon the scatterometry measurements to accept the current wafer, and/or make slight adjusts in the process so as to reduce the amount of undercut in subsequent wafers.

In another aspect of the present invention, the scatterometry system monitors and measures the amount of residual BARC material in the structure, e.g., a hole. More specifically, the development process works to remove not only the photoresist in the structure, but also the BARC material of the BARC layer at the base of the structure. The disclosed monitor and control system measures the reducing thickness of the BARC layer material during the development process to ensure that substantially all of the BARC material is removed. Again, if not, alternative measures can be taken, e.g., etch to remove the BARC or rework the piece.

The disclosed novel architecture operates to monitor at least one of the undercut associated with the sidewall profiles at the BARC layer and thickness of the BARC material being removed during development, and is capable of measuring both substantially simultaneously.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

DETAILED DESCRIPTION OF THE INVENTION

Figure 1:
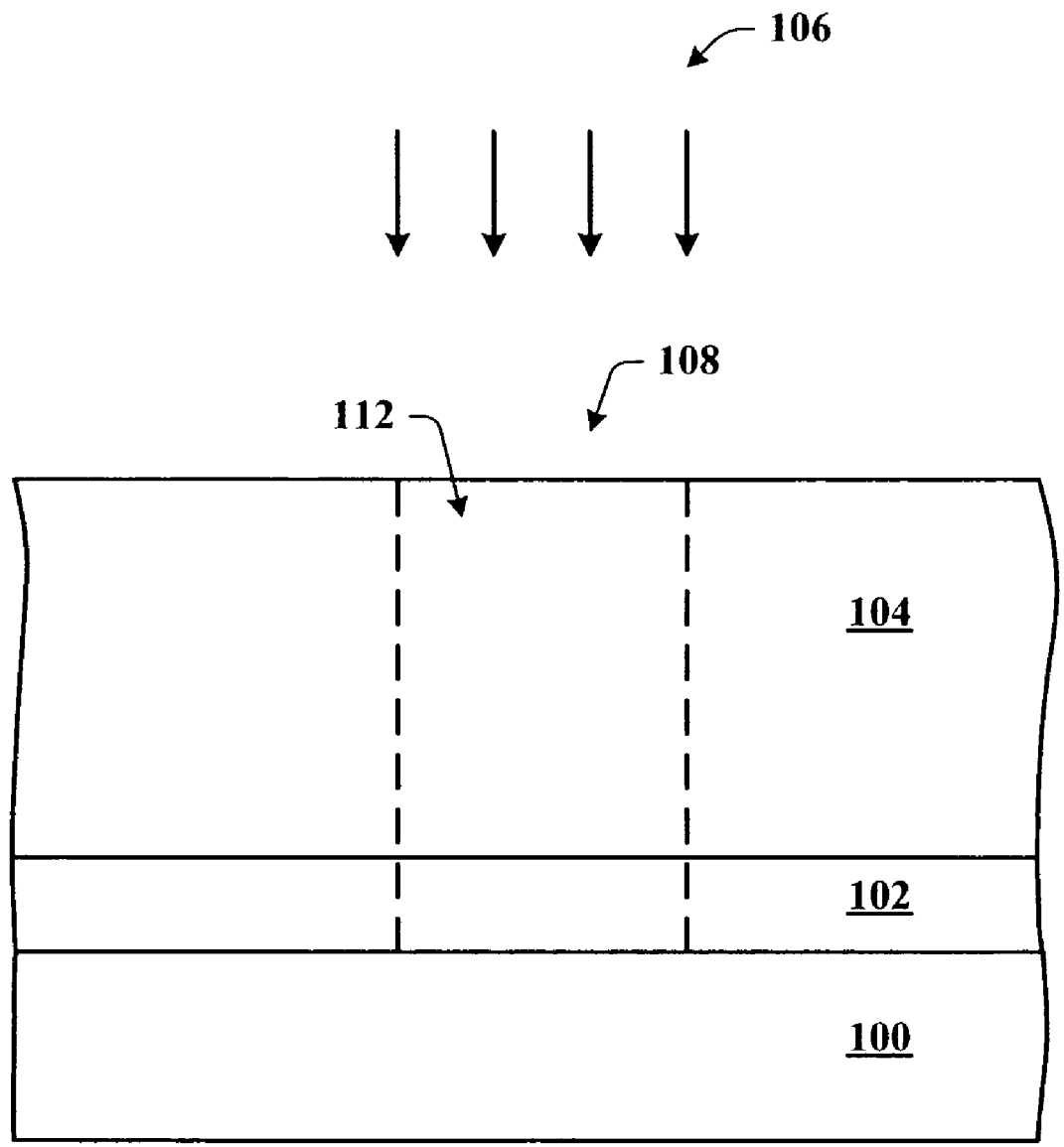
FIG. 1 illustrates a sectional view of a photoresist and BARC structure profile.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Referring now to FIG. 1, there is illustrated a sectional view of a photoresist and BARC structure. There is provided a substrate layer 100 that can include any number of sublayers, for example, an insulating layer of an ILD (interlevel dielectric) between wiring layers. Such ILD (and layer) materials are well known in the art, and include silicon oxide ($SiO_x$) and silicon nitride ($SiON_x$), and various combinations thereof. The substrate layer 100 may also comprise aluminum, polysilicon, or Silox, for example.

A BARC layer 102 is formed over the substrate layer 100 to minimize reflections during the lithography processes. The BARC layer 102 may be made from, for example, a conventional spin-on organic materials such as polyimides, polysulfones, and the like. The BARC may be KrF17b from AZ-CLARIANT or AR7, for example. A photoresist layer 104 formed over the BARC layer 102. Processes for forming the BARC layer 102 and photoresist layer 104 are well known in the art, and typically include spin-on and CVD (Chemical Vapor Deposition) techniques. The BARC solution can be spun uniformly over the wafer surface at a particular point in semiconductor process, and typically at a thickness ranging from about 25 nm to about 150 nm.

Photolithography is a process whereby an image is formed in the resist film layer 104 during development by exploiting the difference in dissolution rates of the exposed and unexposed regions. Pattern formation, using a chemically amplified photoresist with photoacid generators, begins with the generation of an acid catalyst during exposure to light 106 (or other forms of radiation). The photoacid generator may be suitable for a variety of irradiation sources, including, for example, mercury g-line (436 nm), h-line (405 nm), i-line (365 nm), KrF laser (248 nm), and ArF laser (193 nm). The photoresist layer 104 formed over the BARC layer 102 can include a number of structures 108 such as openings or holes formed therein relative to, e.g., a resist line, using conventional processes such as for forming contact holes or vias to interconnect lines and/or layers. Here, the image is used to form a hole or via 108 that has sidewalls (represented by dashed vertical lines).

Ideally, BARC material that is within the bounds of the hole region 108 and that is under resist material 112 in the hole region 108 will be etched uniformly and completely after removing the resist material 112, without any undercut effects along the sidewalls of the hole region 108 and without residual BARC material remaining at the base of the hole region 108 (also the top surface of the substrate layer 100).

Figure 2:
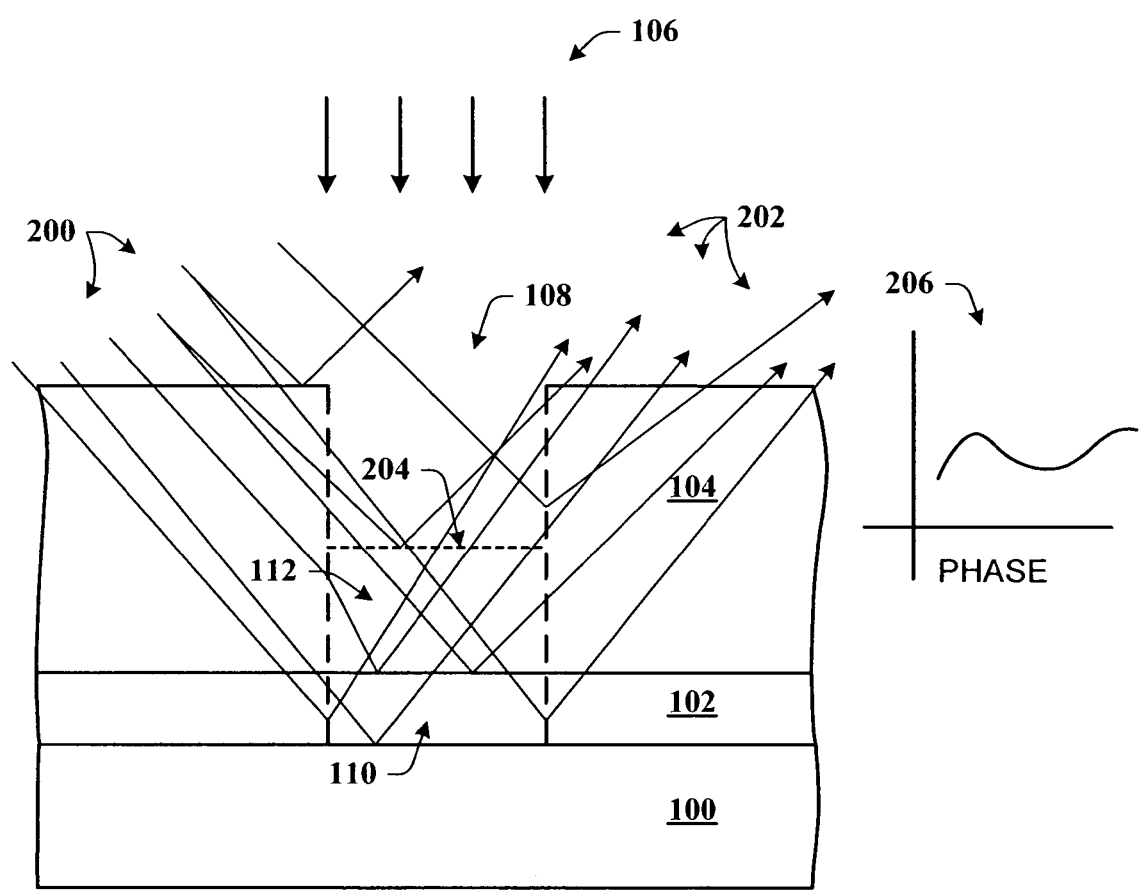
FIG. 2 illustrates a sectional view of FIG. 1 with the photoresist in the hole in the process of being removed and sample complex reflections and refractions of scatterometry from various materials and layers thereof.

Referring now to FIG. 2, there is illustrated a sectional view of FIG. 1 with the photoresist in the hole in the process of being removed and sample complex reflections and refractions of scatterometry from various materials and layers thereof. Scatterometry is a technique for extracting information about a surface upon which an incident light has been directed. Scatterometry is a metrology that relates the geometry of a sample to its scattering effects. Scatterometry is based on the reconstruction of a grating profile from its optical diffraction responses. Scatterometry can be employed to acquire information concerning properties including, but not limited to, horizontal/vertical shifting-compression-stretching, dishing, erosion, profile, thickness of thin films, and critical dimensions of features present on a surface. The information can be extracted by comparing the phase and/or intensity of a reference light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the location of gratings on the surface, distortion of gratings on the surface, the chemical properties of the surface, the planarity of the surface, features on the surface, voids in the surface, and the number and/or type of layers beneath the surface. In the present invention, the phase and/or intensity of the reflected and/or diffracted light will be examined as it relates to distortion measurements desired on the wafer being fabricated.

Different combinations of the above-mentioned properties will have different effects on the phase and/or intensity of the incident light resulting in substantially unique intensity/phase signatures in the complex reflected and/or diffracted light. Thus, by examining a signal (signature or stored value) library of intensity/phase signatures, a determination can be made concerning the properties of the surface. Such substantially unique intensity/phase signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk, \text{ where } j \text{ is an imaginary number.}$$

The signal (signature) library can be constructed from observed intensity/phase signatures and/or signatures generated by modeling and simulation. By way of illustration, when exposed to a first incident light of known intensity, wavelength and phase, a first grating on a wafer can generate a first intensity/phase signature. Similarly, when exposed to the first incident light of known intensity, wavelength and phase, a second grating on a wafer can generate a second intensity/phase signature. For example, a line of a first width may generate a first signature while a line of a second width may generate a second signature. Observed signatures can be combined with simulated and modeled signatures to form the signal (signature) library. Simulation and modeling can be employed to produce signatures against which measured intensity/phase signatures can be matched. In one exemplary aspect of the present invention, simulation, modeling and observed signatures are stored in a signal (signature) library containing over three hundred thousand intensity/phase signatures. Thus, when the intensity/phase signals are received from scatterometry detecting components, the intensity/phase signals can be pattern matched, for example, to the library of signals to determine whether the signals correspond to a stored signature.

Referring again to FIG. 2, there is an incident light beam of multiples rays 200 imposed at a location associated with the hole region 108. Reflections of the rays 200 occur at various layer boundaries and material transitions that exhibit different indexes of refraction during development of the photoresist 104. Thus, reflected rays 202 are received from various layers (100, 102, and 104) during the development process, including the surface 204 of the resist material 112 as it is being removed and sidewalls of the resist layer 104 and the sidewalls of the BARC layer 102. The reflected rays 202 are processed into spectra data 206, which spectra data 206 is further used in comparison with calibrated spectra data (i.e., a wafer-to-database system) stored in a process and scatterometry monitor and control system. Note that comparison of the spectra data 206 can also be accomplished in a wafer-to-wafer regime such that current scatterometry spectra measurements are compared to previous spectra measurements of a previous wafer on the production line. The previous wafer can be that which was just before the current wafer, or even selected to be the third or sixth previous wafer, for example.

The wafer-to-wafer measurement technique can be configured to not only make measurements relative to previous wafers, but also to a predetermined ideal value stored in the monitor and control system. Thus, although the system may measure an acceptable gradual change from wafer to wafer, which all could be within a specified tolerance relative to one another (i.e., the accuracy slips slightly from wafer to wafer, yet is still within an acceptable tolerance), a second comparison with the ideal value should catch absolute degradation in the process.

Therefore, there exists stored spectra data associated with ideal structure parameters (i.e., no undercut regions in the BARC layer and total uniform development and removal of the resist material 112 and BARC material 110) against which can be compared production line measurements. Of course, the spectra data 206 includes the diffraction information of many other structures within the location of interest, for example, underlying device structures and other formations that may be expected to be in the location of interest.

A grating structure (not shown) facilitates the use of scatterometry to analyze selected areas of the wafer during production line processes. In particular, the grating structure allows for mapping of the wafer such that selected areas or locations of interest may be analyzed and processed for acceptable or unacceptable BARC diffusion progress during the development and etch processes.

Figure 3A:
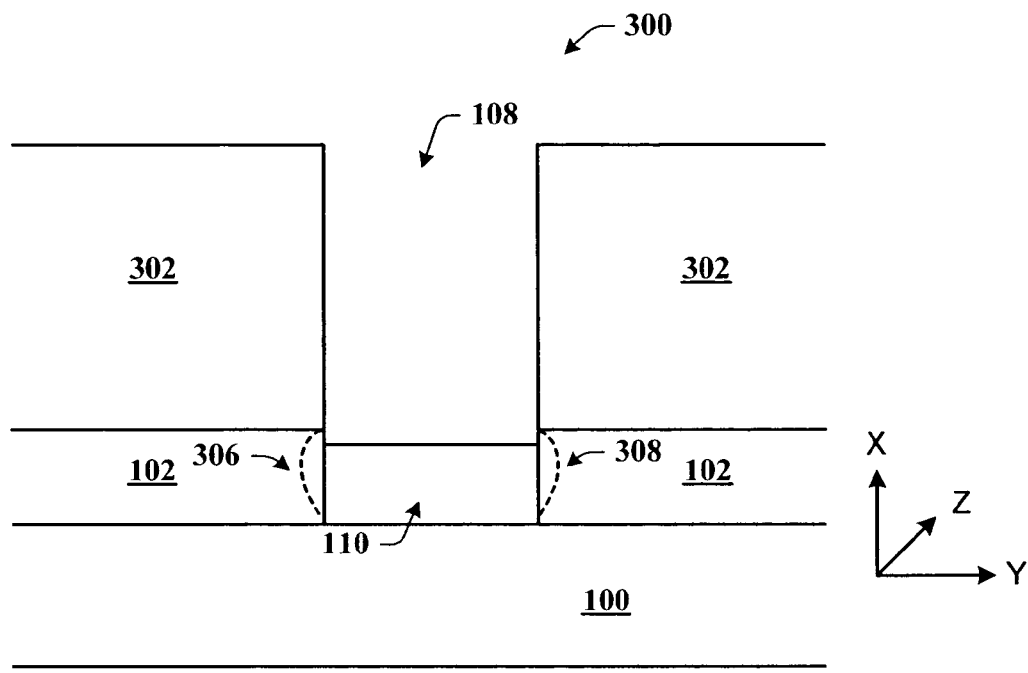
FIG. 3A illustrates a sectional view of a resulting development process for a structure showing undercut as monitored utilizing the architecture of the present invention.

Referring now to FIG. 3A, there is illustrated a sectional view of a resulting development process for a structure 300 showing undercut as monitored utilizing the architecture of the present invention. A patterned photoresist layer 302 is processed over the BARC layer 102 that includes one or more of the openings 108 therein. The opening 108 extends from the surface of the photoresist layer 302 to the bottom of the BARC layer 102, which is also the top of the substrate layer 100.

As the development process continues, scatterometry monitors complete removal of the resist 112 (of FIG. 2) and removal of the BARC material 110 (of FIG. 2) at the base of the hole region 108. Ideally, the development process performs complete removal of both the resist 112 and BARC material 110.

However, during the development process, acid is created in the photoresist material (not shown) of the hole region 108 by photolysis or radiolysis of the photoacid generator dispersed within the photoresist material. The acid diffuses from the developing photoresist of the hole region 108 into the BARC layer 102 facilitating undercut. Undercut is a deviation from a sidewall profile at the base of the hole region 108 where the sidewall profile(s) normally exhibit straight (or vertical) sidewalls during removal of the resist and BARC material in the hole region 108. Thus, as the undercut deviates further from the sidewall profile during the development process, as measured by the scatterometry, the system processes the measured scatterometry spectra data and determines if the undercut has reached a threshold beyond which alternative measures must be taken for processing the wafer.

The undercut is defined by concavities (represented by the dotted lines) of material loss denoted as undercut regions (306 and 308) in the sidewall areas at the base of the hole 108. More specifically, in one suboptimal development process, as development reduces the thickness of the BARC material 110 in the hole region 108, undercut occurs causing deviation from the sidewall profiles at the base of the hole 108. Thus, the sidewall profiles exhibit deviation therefrom in the form of the undercut regions (306 and 308) along the sidewalls such that the BARC material is removed laterally in, for example, a continually increasing radius as the vertical thickness of BARC material 110 in the hole region is reduced.

Figure 3B:
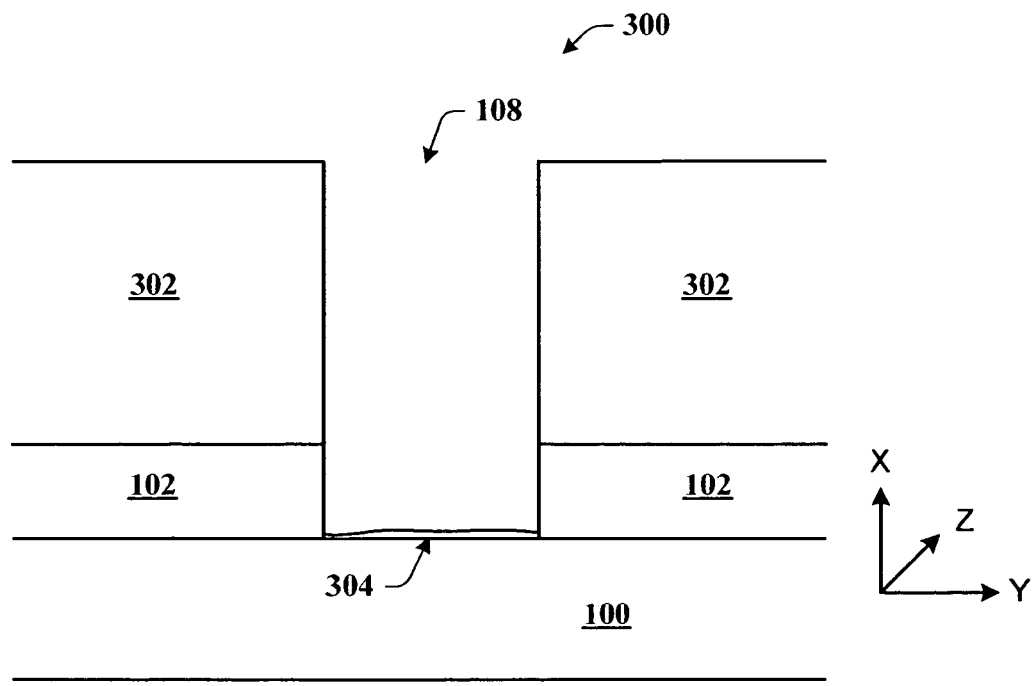
FIG. 3B illustrates a sectional view of a resulting development process for a structure showing residual BARC material as monitored utilizing the architecture of the present invention.

Referring now to FIG. 3B, there is illustrated a sectional view of a resulting development process for a structure showing residual BARC material 304 as monitored utilizing the architecture of the present invention. In another development process, undercut may reduced or even eliminated by optimal monitor and control of the development process in accordance with the present invention. However, a residual portion 304 of the BARC material may remain. Since the thickness of the BARC layer 102 is known, the system can determine the presence and parameters of any residual BARC portion 304 at the base of the hole 108 at the end of the development process. If so, the development process for the next wafer can be adjusted to provide for total removal of the BARC material 110. Alternatively, the current wafer can be reworked under the adjusted process parameters to ensure that all of the BARC material is removed.

It is to be appreciated that the portions of the substrate layer 100 may also be involved with the fabrication process such that the undercut in the BARC layer 102 affects device fabrication or portions thereof in the substrate 100. Thus, the effects of the undercut may result in undercut for an overlying layer, and yet cause the formation of undesirable structure dimensions in the underlying layer(s).

The system of the present invention seeks to monitor and control the process using scatterometry by monitoring continually the thickness of residual BARC material 304 and/or progress of the undercut regions (306 and 308) in the BARC layer 102 as compared with the sidewall profiles such that the development process can be controlled to mitigate such undercut effects in subsequent wafers, or for a rework of the current wafer. Since sidewall profile deviation at the BARC layer 102 is continually monitored, the rate of undercut material loss can be calculated. If the undercut material is etched at a rate that ultimately exceeds a predetermined amount or thickness, the system controls the development process to reduce such effects. Note also that the amount of BARC material 110 may be monitored relative to the amount of material loss in the undercut regions (306 and 308).

Note that scatterometry can be used to monitor and measure undercut in the undercut areas (306 and 308) and residual material thickness in any combination thereof. For example, one undercut region 306 (or 308) can be monitored separately or in combination with monitoring the thickness of the BARC material in the hole region 108. Alternatively, both undercut regions (306 and 308) and thickness of the developing BARC material can be monitored for any residual material 304. If monitoring both undercut regions (306 and 308), measurements to both regions can be made and then averaged to arrive at a value that used to determine if the wafer should be accepted, rejected, or rerouted to rework or etch back of the BARC.

Alternatively, the measurements can be made according to an interleaved method whereby a first thickness measurement is made on the undercut region 304 in one sample period, a second thickness measurement is made at the undercut region 308 in a following sample period, and thickness measurement of the BARC material is made in a following sample period. These thickness measurements can then be averaged or processed to arrive at a result. Of course, no averaging need be performed such that either measured thickness value can be used to determine if BARC undercut has progressed to an impermissible point. Since such measurements are made according to a predetermined sample rate, the rate of BARC undercut can also be determined, as well as the expected time to completion for removal of the BARC material in the hole region 108, which rate information can be used to predict when the undercut boundary will reach the impermissible distance and/or the BARC material is removed from the hole.

Note that the ultimate undercut value can consider triaxial parameters of the undercut profile. That is, using an x-y-z axis, where the x-axis is vertical, the y-axis is horizontal, and the z-axis is perpendicular to the page, any single axial parameter or combination of axial parameters can be used to derive the ultimate value used to determine whether the wafer is allowed, rejected, or rerouted for rework or etch back. Each of these measurements affects the spectra data associated with the undercut region during the development process. Similarly, the reducing thickness of the BARC material in the hole region 108 affects the spectra data such that unique spectra data can be processed to determine the state of the BARC layer relative to undercut and residual BARC material.

Note also that the rate of increase of undercut deviation from the sidewall profile can be monitored such that if the rate of increase meets or exceeds a predetermined rate, the process is controlled to adjust process parameters to mitigate undercut or ultimately, to reroute the wafer.

In one embodiment, the via or contact hole 108 has a width (in the y direction) of 250 nm, deviation of the undercut region 306 (and/or 308) from the sidewall profile ranges from about 75 nm to about 175 nm with the permissible undercut deviation approximating no more than about 125 nm. In another embodiment, where the via or contact hole 108 has a width of about 200 nm, deviation of the undercut region 304 (and/or 308) from the sidewall profile ranges from about 65 nm to about 135 nm with the permissible undercut deviation approximating no more than about 100 nm. In yet another embodiment, where the via or contact hole 108 has a width of about 150 nm, deviation of the undercut region 304 (and/or 308) from the sidewall profile ranges from about 50 nm to about 100 nm with the permissible undercut deviation approximating no more than about 75 nm. Thus, when the BARC undercut deviation exceeds approximately one-half of the hole or via width, the wafer will be rerouted for further processing, which includes but is not limited to, rework, etch back of the affected hole structures or layer, or rejection of the wafer.

Additionally, either one or both of the undercut regions (306 and 308) are profiled in spectra data according to various stages of development and used for comparison in the production line environment. As the development process commences, scatterometry is used to at least measure (or profile) the development progress (and hence, undercut progress) in the BARC layer 102 such that if the undercut exceeds the predetermined acceptable values (an impermissible state), the process is stopped, and the wafer can then be rerouted to a different process for either reworking or etch back to remove the BARC.

However, it is to be appreciated that there can be a permissible level of undercut such that device integrity during fabrication will not be jeopardized. In such a situation, production line measurements indicating that the undercut is not progressing beyond the impermissible value will be processed to allow further fabrications on that wafer. Similarly, there can be a permissible amount of residual BARC material 304 left in the hole such that rerouting of the wafer for rework or etch-back is not required.

Figure 4:
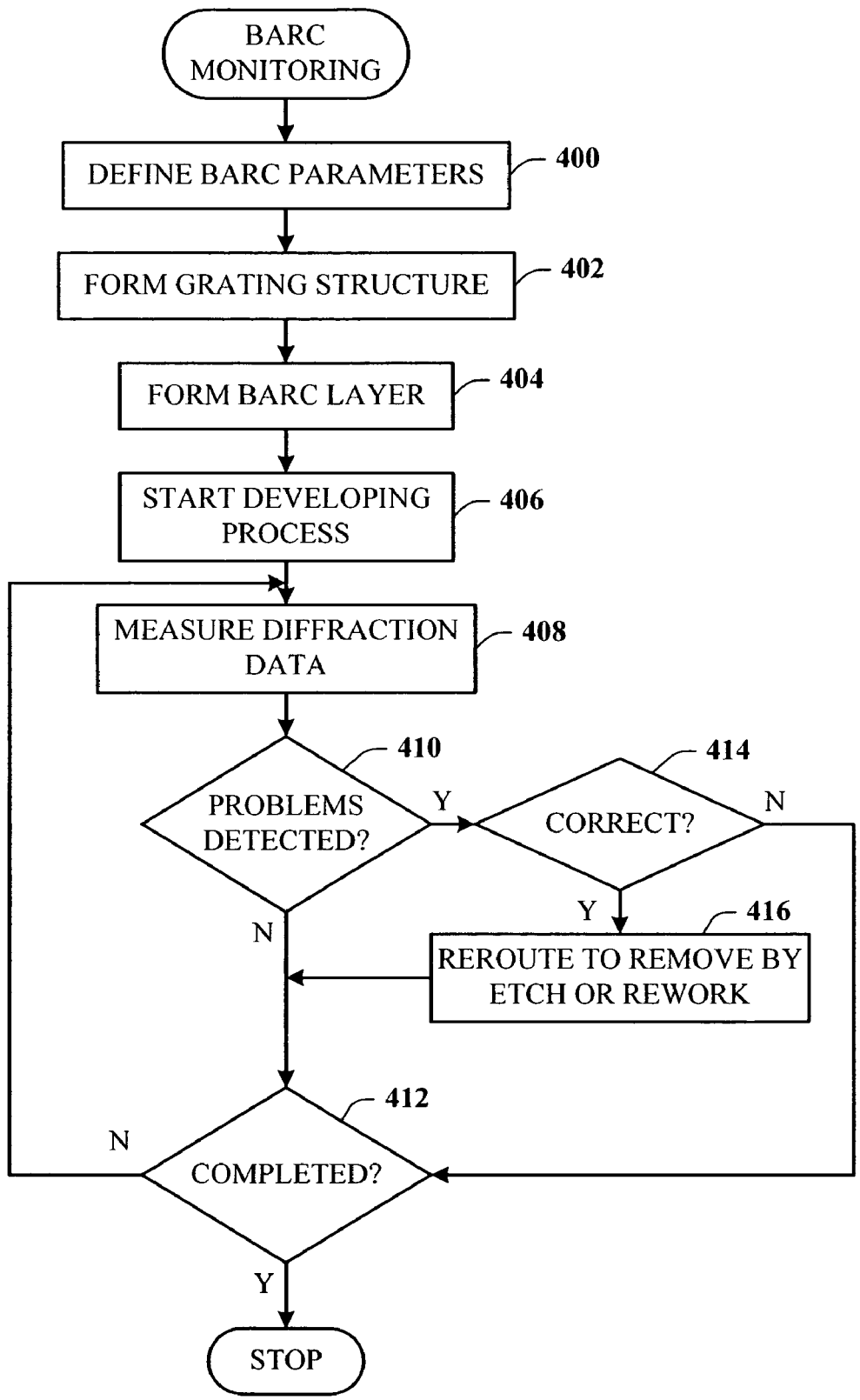
FIG. 4 illustrates a flow chart of a process for detecting BARC problems during the developing process.

Referring now to FIG. 4, there is illustrated a flow chart of a process for detecting BARC problems during the developing process. While, for purposes of simplicity of explanation, the one or more methodologies shown herein, e.g., in the form of a flow chart, are shown and described as a series of acts, it is to be understood and appreciated that the present invention is not limited by the order of acts, as some acts may, in accordance with the present invention, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

At 400, parameters are defined for BARC undercut and residual BARC material at the base of the hole. This can include, for example, spectra data for an ideal development process, spectra data that represents various stages of undercut and residual hole material, the amount of permissible undercut and/or residual BARC material, and rate of increase of the undercut. At 402, a grating structure is applied, or perhaps has already been applied during an earlier process. In any case, the grating structure facilitates analyzing selected locations of the wafer, and recording the spectra data for these locations for later processing. At 404, the BARC layer is formed. At 406, the developing process is initiated. At 408, diffraction data (or spectra data) is measured and processed using scatterometry. At 410, a determination is made as to whether any undercut or residual material has been detected. If NO, flow is to 412 to determine if the process has completed. If NO, flow is from 412 to the input of 408 to take another sample of the diffraction data using the scatterometry system. However, if the process has completed, flow is from 412 to a Stop block.

If undercut and/or residual material has been detected, flow is from 410 to 414 to process the measured spectra data to determine if correction is required due to excessive undercut (or amount of residual material) or if the undercut (or amount of residual material) is within permissible parameters. If no correction is required, flow is from 414 to 412 to determine if the process has completed. If correction of the wafer is required, flow is from 414 to 416 to reroute the wafer for either reworking or removal of the BARC by etching. Flow would then reach the Stop block for that piece.

Figure 5:
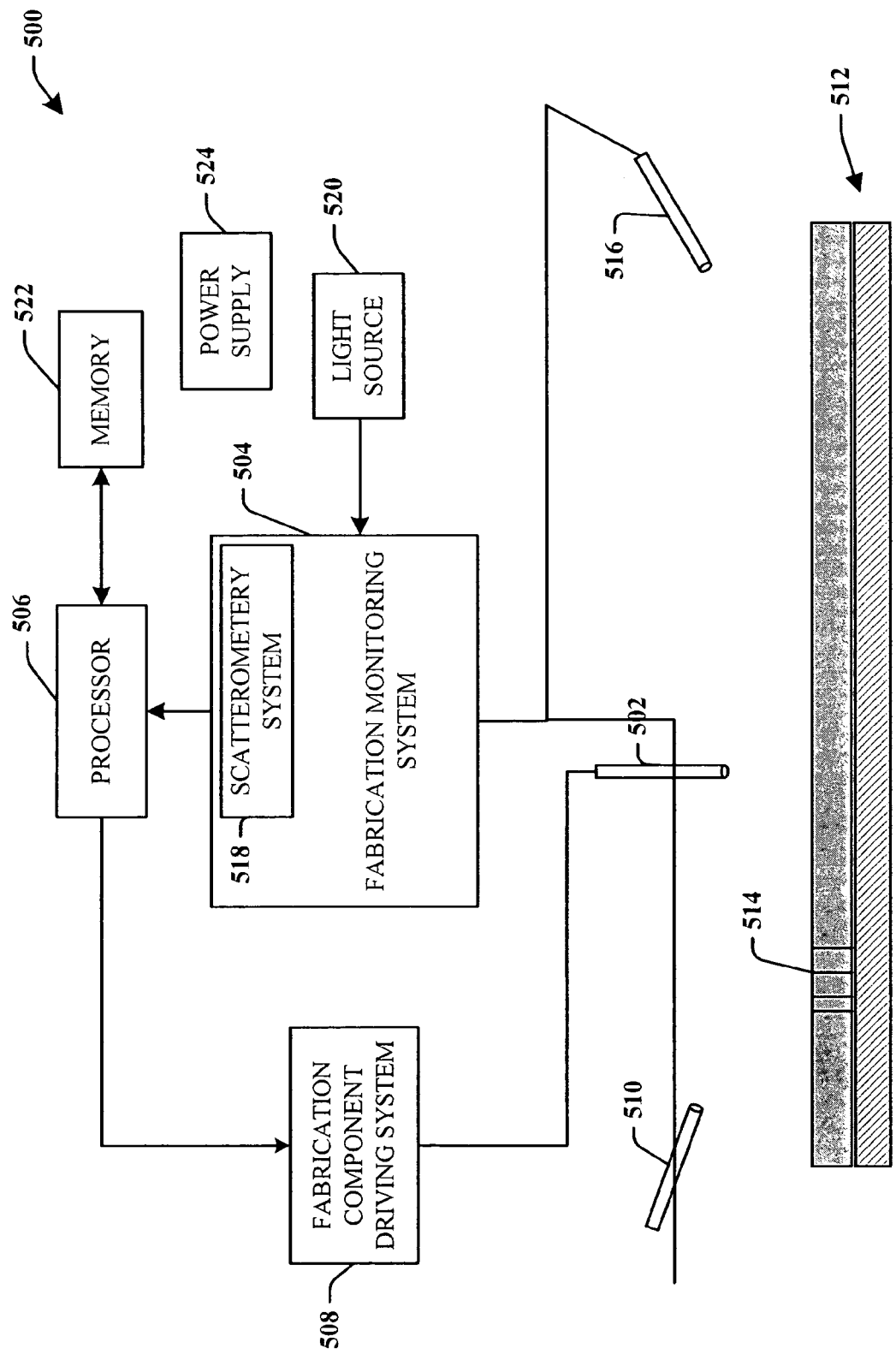
FIG. 5 illustrates a system for monitoring and controlling fabrication processes.

Referring now to FIG. 5, there is illustrated a system 500 for monitoring and controlling fabrication processes. The system 500 operates to control one or more fabrication components 502 in order to monitor and/or control a fabrication process (e.g., lithography, deposition, annealing, etching, developing, etc.). A fabrication monitoring system 504, a processor 506, and a fabrication component driving system 508 work cooperatively to control one or more of the fabrication components 502.

The fabrication component(s) 502 are coupled to and controlled directly by the fabrication component driving system 508. The fabrication component driving system 508 receives information and/or instructional commands from the processor 506. The processor 506 determines the content and type of information transmitted to the fabrication component driving system 508 according to its analysis of data received from and collected by the monitoring system 504. Thus, through the interaction of components 502, 504, 506, and 508, the system 500 has the capability to adapt to an underway fabrication process.

In one example of the present invention, through machine learning, the system 500 may automatically improve subsequent fabrication processes for similar wafers and/or layers. In addition, by communicating measurements relating to recently fabricated patterns/wafers to the processor 506, the processor 506 can control the fabrication component driving system 508, which can thus regulate the one or more fabrication components 502 to facilitate obtaining more precise and improved fabrication processes.

The system 500 includes one or more target light sources 510 to project light onto respective portions of a wafer 512 and/or a grating 514 on the wafer 512. A portion of the wafer 512 may have one or more gratings 514 and/or features located on that portion. Light reflected and/or refracted by the one or more gratings 514 is collected by one or more light detecting components 516, and processed by a fabrication monitoring system 504 to measure at least one parameter relating to the fabrication of integrated circuits on the wafer 512. For example, spaces between portions of the grating 514 can be measured and compared to desired critical dimensions (CDs). The reflected light is measured with respect to the incident light in order to obtain the various parameters relating to the gratings 514.

The monitoring system 504 may include a scatterometry system 518. It is to be appreciated that any suitable scatterometry system may be employed to carry out the present invention, and such systems are intended to fall within the scope of the claims appended hereto.

A light source 520 (e.g., a laser) provides light to the one or more target light sources 510 via the monitoring system 504. Preferably, the light source 520 is a frequency-stabilized laser, however, it will be appreciated that any laser or other light source (e.g., laser diode or helium neon (HeNe) gas laser) suitable for carrying out the present invention may be employed. One or more light detecting components 516 (e.g., photo detector, photo diodes) collect light reflecting from, or refracted by the one or more gratings 514. The monitoring system 504 may also process the measured light data into a data form compatible with or understandable to the processor 506.

The processor 506 is operatively coupled to the monitoring system 504 and receives the measured grating data from the monitoring system 504. The processor 506 determines distortion measurements and the acceptability and/or progress of the fabrication of respective portions of the wafer 512 by examining grating measurements and comparing such grating measurement values to stored acceptable and unacceptable values. The values may be associated with one or more signatures stored, for example, in a memory 522. In determining the acceptability and/or progress of an on-going and/or recently completed fabrication process, the processor 506 may also determine to what extent, if any, adjustments to the fabrication components 502 may be attempted to optimize subsequent fabrication processes. Upon making the determination, the processor 506 transmits this information to the fabrication component driving system 508, which then makes one or more adjustments to the fabrication components 502.

As described above, the processor 506 is also coupled to the fabrication component driving system 508 that directs and controls the one or more fabrication components 502 (e.g., temperature controllers, pressure controllers, formulae controllers, concentration controllers, etc.). In one example of the present invention, the fabrication component driving system 508 is controlled, at least in part, by the processor 506 to selectively vary the operation of the respective fabrication components 502. Respective portions of the wafer 512 are associated with one or more corresponding fabrication components 502. The processor 506 monitors the development of one or more patterns and/or one or more gratings 514, and selectively regulates the corresponding fabrication components 502. The transmission and relay of information between the monitoring system 504, the processor 506, the fabrication component driving system 508, and the fabrication components 502 creates effective feed back control that facilitates improving IC quality by producing more precisely fabricated features with less distortion.

The processor 506, or central processing unit, may be any of a plurality of processors, such as the AMD K7, Athlon, and other similar, or more advanced processors. The processor 506 is programmed to control and operate the various components within the system 500 in order to carry out the various functions described herein. The manner in which the processor 506 is programmed to carry out the functions relating to the present invention will be apparent based on the description provided herein.

The memory 522, which is operatively coupled to the processor 506, is also included in the system 500 and serves to store, among other things, program code executed by the processor 506 for carrying out operating functions of the system 500 as described herein. For example, the memory 522 can hold patterns (e.g., spectra data) to which observed data can be compared. The memory 522 also serves as a storage medium for temporarily storing data such as distortion measurements, fabrication progress values, fabrication progress tables, component coordinate tables, grating sizes, grating shapes, scatterometry information, achieved CDs, desired CDs and other data that may be employed in carrying out the present invention.

A power supply 524 provides operating power to the system 500. Any suitable power supply (e.g., battery, line power) may be employed to carry out the present invention.

Figure 6:
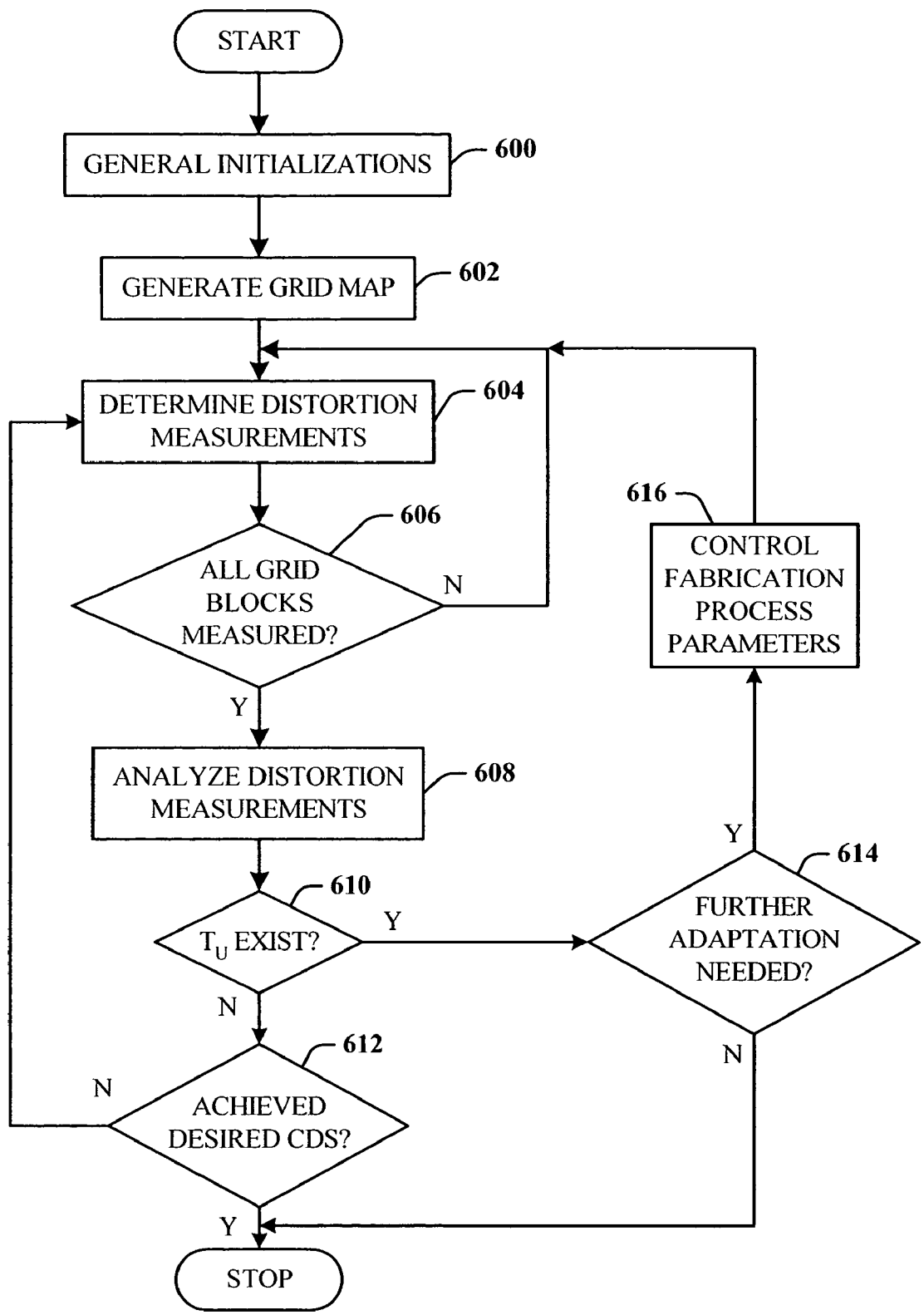
FIG. 6 illustrates a flow diagram illustrating a methodology for carrying out the present invention.

Referring now to FIG. 6, there is illustrated a flow diagram illustrating a methodology for carrying out the present invention. At 600, general initializations are performed. Such initializations can include, but are not limited to, establishing pointers, allocating memory, setting variables and establishing communication channels. At 602, a grid map of one or more grid blocks "XY" is created. At 604, distortion measurements and/or fabrication progress determinations are made with respect to the various wafer portions mapped by the respective grid blocks XY. At 606, a determination is made concerning whether all grid block measurements have been taken. If the determination at 606 is NO, then processing returns to 604. If the determination at 606 is YES, then at 608, distortion measurements and/or fabrication progress values are analyzed and compared against acceptable values and measurements for the respective portions of a wafer. In an alternative example of the present invention, the determination at 606 may concern whether a sufficient number of grid blocks have been measured to facilitate valid CD analysis.

At 610, a determination is made concerning whether distortion values and/or fabrication progress values are acceptable. If such values are acceptable, then processing continues at 612 where a determination is made concerning whether desired CDs have been achieved. If desired CDs have been achieved, then processing can conclude at a Stop block. Otherwise, processing continues at 604. If unacceptable values are found at 610, processing proceeds to 614 where a determination is made concerning whether further adaptation is warranted. If YES, flow is to 616 to control the fabrication process parameters accordingly, and then return to 604 to perform another iteration.

By way of illustration, the unacceptable values may indicate that portions of the wafer and/or the entire wafer being processed have been damaged (e.g., distorted) by stress to such an extent that further adaptations to the fabrication process are unwarranted. Such a damaged portion and/or wafer may be marked for discard. By way of further illustration, analysis of the unacceptable values may indicate that a simple adaptation is appropriate, which may facilitate minimizing wafer discard. If no further adaptations are warranted, the present iteration is then ended at the Stop block.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A mehtod for controlling a semiconductor process, comprising:
    forming a bottom anti-reflective coating BARC layer on a wafer;
    forming photoresist over the BARC layer;
    developing the photoresist, the development process causing acid diffusion into the BARC layer;
    developing the BARC layer;
    while developing the BARC layer, monitoring a thickness and a sidewall profile of the BARC layer using a scatterometry system; and
    processing the wafer based upon a state of the BARC layer.

2. The method of claim 1, the state of the BARC layer is based upon the sidewall profile, which is associated with undercut of the BARC layer.

3. The method of claim 1, the BARC layer comprises a spin-on organic material.

4. The method of claim 3, the scatterometry system monitors undercut into the BARC layer.

5. The method of claim 1, further comprising forming a grating structure on the wafer to map locations thereinto.

6. The method of claim 1, further comprising measuring diffraction data in the form of spectra data during the development process to monitor undercut into the BARC layer.

7. The method of claim 1, the BARC layer having a thickness from about 25 nm to about 150 nm.

8. The method of claim 1, further comprising routing the wafer to a process for at least one of rework and etch when the state of the BARC layer is associated with impermissible criteria.

9. A method for controlling a semiconductor process, comprising:
    forming a BARC layer on a wafer;
    forming a photoresist comprising a photoacid generator over the BARC layer;
    developing the photoresist, the development causing acid diffusion into the BARC layer;
    developing the BARC layer;
    while developing the BARC, monitoring a thickness and a sidewall profile of the BARC layer using a scatterometry system; and
    processing the wafer based upon a state of the BARC layer.

10. The method of claim 9, further comprising generating spectra data during the development process to monitor at least one of the thickness of the BARC layer in a structure as it is being developed away and the sidewall profile of the BARC layer.

11. The method of claim 9, the development process facilitates undercut into the BARC layer as monitored in association with the sidewall profile.

12. The method of claim 9, the sidewall profile is associated with patterning of a hole having a width of approximately 250 nm, the sidewall profile exhibits undercut into the BARC layer that ranges from about 75 nm to about 175 nm, and the state of the BARC layer is determined according to a predetermined approximate undercut deviation, which if about 125 nm, the wafer is rerouted for further processing.

13. The method of claim 9, the sidewall profile is monitored according to at least one of rate of undercut, deviation of undercut from the sidewall profile, and triaxial parameters thereof.

14. The method of claim 9, the developing step removes at least one of a developed resist and BARC material of a structure.

15. A method of controlling a semiconductor process, comprising:
    forming a BARC layer on a wafer;
    forming a photoresist layer over the BARC layer;
    developing the photoresist layer and the BARC layer to facilitate formation of a structure, the development causing acid diffusion into the BARC layer;

during the developing process, monitoring a thickness and a sidewall profile of the BARC layer using a scatterometry system; and controlling the semiconductor process based upon the thickness and/or sidewall profile.

16. The method of claim 15, the structure is a hole or via having a width of approximately 150 nm, the undercut into the BARC layer ranges from about 50 nm to about 100 nm, and a state of the BARC layer is determined according to a predetermined undercut parameter that is an undercut deviation of about 75 nm, which when the predetermined undercut deviation is reached, the wafer is rerouted for further processing.

17. The method of claim 15, further comprising forming a grating structure on the wafer to facilitate mapping a plurality of locations such that the scatterometry system can be controlled to selectively monitor and measure at least one of progression of undercut into the BARC layer associated with the sidewall profile and the thickness of the BARC layer in one or more of the plurality of locations.

18. The method of claim 15, further comprising measuring diffraction data associated with one or more undercut regions of corresponding sidewall profiles during the development process by comparing the measured diffraction data with predetermined diffraction data, the comparison of which is processed to determine whether to continue the development process or reroute the wafer for further processing.

19. The method of claim 15, further comprising rejecting the wafer if a deviation distance associated with undercut of the sidewall profile of the BARC layer exceeds one-half of the structure width.

20. The method of claim 15, the development process facilitates undercut of a sidewall profile into the BARC layer, and at least one of an amount of the undercut and a rate of the undercut is monitored by the scatterometry system.

21. The method of claim 15, the scatterometry system is used to monitor sidewall profiles of the BARC layer where undercut occurs laterally along the BARC layer in at least two directions.

22. The method of claim 15, further comprising controlling the scatterometry system to monitor at least a first undercut region of a first sidewall profile, a second undercut region of a second sidewall profile, and BARC material thickness, interleavingly.

23. The method of claim 15, further comprising controlling the scatterometry system to measure and average undercut parameters of corresponding sidewall profiles.

* * * * *